United States Patent
Kato et al.

(10) Patent No.: US 10,604,837 B2
(45) Date of Patent: Mar. 31, 2020

(54) FILM DEPOSITION APPARATUS

(71) Applicant: Tokyo Electron Limited, Tokyo (JP)

(72) Inventors: Hitoshi Kato, Iwate (JP); Shigehiro Miura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 418 days.

(21) Appl. No.: 15/018,987

(22) Filed: Feb. 9, 2016

(65) Prior Publication Data

US 2016/0244877 A1  Aug. 25, 2016

(30) Foreign Application Priority Data

Feb. 23, 2015  (JP) ................. 2015-032804

(51) Int. Cl.
  *C23C 16/455*  (2006.01)
  *C23C 16/46*  (2006.01)

(52) U.S. Cl.
  CPC .. *C23C 16/45544* (2013.01); *C23C 16/45578* (2013.01); *C23C 16/46* (2013.01)

(58) Field of Classification Search
  CPC ........ C23C 16/45544; C23C 16/45578; C23C 16/46
  See application file for complete search history.

(56) References Cited

U.S. PATENT DOCUMENTS

| | | | |
|---|---|---|---|
| 2009/0078202 A1* | 3/2009 | Strikovski | C23C 14/541 118/725 |
| 2010/0260935 A1* | 10/2010 | Kato | C23C 16/402 427/255.28 |

FOREIGN PATENT DOCUMENTS

| | | |
|---|---|---|
| JP | S60-086789 | 5/1985 |
| JP | S61-136676 | 6/1986 |
| JP | 2005330518 A  * | 12/2005 |
| JP | 2006097080 A  * | 4/2006 |
| JP | 2006-245491 | 9/2006 |
| JP | 2007-157552 | 6/2007 |
| JP | 2010-245448 | 10/2010 |
| JP | 2013-118411 | 6/2013 |
| KR | 10-2010-0112532 | 10/2010 |

* cited by examiner

*Primary Examiner* — Kambiz Zand
*Assistant Examiner* — Mirza Israr Javed
(74) *Attorney, Agent, or Firm* — IPUSA, PLLC

(57) ABSTRACT

A film deposition apparatus includes a process chamber having a substantially cylindrical shape, and a turntable to receive a substrate thereon provided in the process chamber. At least one gas nozzle extends toward a central axis of the turntable from an inner side wall of the process chamber above the turntable along a radial direction of the turntable. At least one inner side wall heater is provided to cover at least part of the inner side wall of the process chamber and/or at least part of a surrounding area of the central axis of the turntable in a wall-shaped manner.

10 Claims, 10 Drawing Sheets

FILM DEPOSITION APPARATUS

CROSS-REFERENCE TO RELATED APPLICATION

The present application is based upon and claims the benefit of priority of Japanese patent application No. 2015-032804, filed on Feb. 23, 2015, the entire contents of which are incorporated by reference in their entirety.

BACKGROUND OF THE PRESENT INVENTION

1. Field of the Present Invention

The present invention relates to a film deposition apparatus.

2. Description of the Related Art

Conventionally, as disclosed in Japanese Laid-Open Patent Application Publication No. 2013-118411, a turntable-type film deposition apparatus using ALD (Atomic Layer Deposition) or MLD (Molecular Layer Deposition) is known. The film deposition apparatus includes a turntable capable of receiving a plurality of substrates along a circumferential direction of the turntable in a vacuum chamber, and a first reaction gas supply part and a second reaction gas supply part provided apart from each other in a rotational direction of the turntable. In ALD and MLD, a thin film is deposited on surfaces of the substrates by supplying a first process gas and a second process gas that are reactable with each other from the first reaction gas supply part and from the second reaction gas supply part in series, respectively, to the surfaces of the substrates, and by repeating this supply cycle so as to deposit a reaction product of the first reaction gas and the second reaction gas in a layer-by-layer manner.

In a film deposition apparatus disclosed in Japanese Laid-Open Patent Application Publication No. 2013-118411, at least one of a first reaction gas supply part and a second reaction gas supply part is configured to be an activated gas injector. The activated gas injector includes a flow passage formation member dividing a flow passage into a gas activation flow passage and a gas introduction flow passage by a partition wall, a gas introduction port for introducing a process gas into the gas introduction flow passage, and a pair of electrodes provided extending along the partition wall in parallel with each other in the gas activation flow passage and configured to receive electricity to activate the process gas. The activated gas injector further includes communication holes provided in the partition wall along a lengthwise direction of the pair of electrodes to supply the process gas in the gas introduction flow passage to the gas activation flow passage, and gas discharge holes provided in the gas activation flow passage along the lengthwise direction of the electrode in order to discharge the process gas activated by the gas activation flow passage.

In the above-mentioned turntable-type film deposition apparatus, because a moving speed of the turntable during one revolution differs at the central side and the peripheral side, an adsorption amount of the process gas on the plurality of substrates placed along the circumferential direction of the turntable differs at the central side and the peripheral side, which sometimes has a negative impact on uniformity of a film deposited on the substrates across the surfaces of the substrates. However, the uniformity of the film across the surface of the substrate can be improved by using the activated gas injector disclosed in Japanese Laid-Open Patent Application Publication No. 2013-118411 because the activated gas injector can distribute the supply of the process gas. More specifically, by controlling concentration distribution of the process gas and a period of time of contacting the process gas, the process gas is caused to uniformly adsorb on the substrate across the surface and the uniformity of the film thickness across the surface of the substrate can be made preferable. Moreover, for example, when there is a demand of film deposition under high pressure conditions, the uniformity of the film thickness across the surface of the substrate can be controlled by supplying a large amount of carrier $N_2$ gas to the process gas so as to increase a flow rate of $N_2$ in order to adjust displacement of the process gas in the activation gas injector.

However, when there is a demand of film deposition under further higher pressure conditions in the future, the flow rate of carrier $N_2$ gas is increased for the gas displacement to respond to the demand, but such a response has limitations because the increase of the supply of $N_2$ gas causes the decrease of the activation of the process gas to be supplied to the substrates.

SUMMARY OF THE PRESENT INVENTION

An embodiment of the present invention provides a film deposition apparatus that can adjust uniformity of film deposition across a surface of a substrate while implementing activation of a gas.

According to an embodiment, there is provided a film deposition apparatus that includes a process chamber having a substantially cylindrical shape, and a turntable to receive a substrate thereon provided in the process chamber. At least one gas nozzle extends toward a central axis of the turntable from an inner side wall of the process chamber above the turntable along a radial direction of the turntable. At least one side wall heater is provided to cover at least part of the inner side wall of the process chamber and/or at least part of a surrounding area of the central axis of the turntable in a wall-shaped manner.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF PREFERRED EMBODIMENTS

A description is given below of embodiments of the present invention with reference to accompanying drawings.

Figure 1:
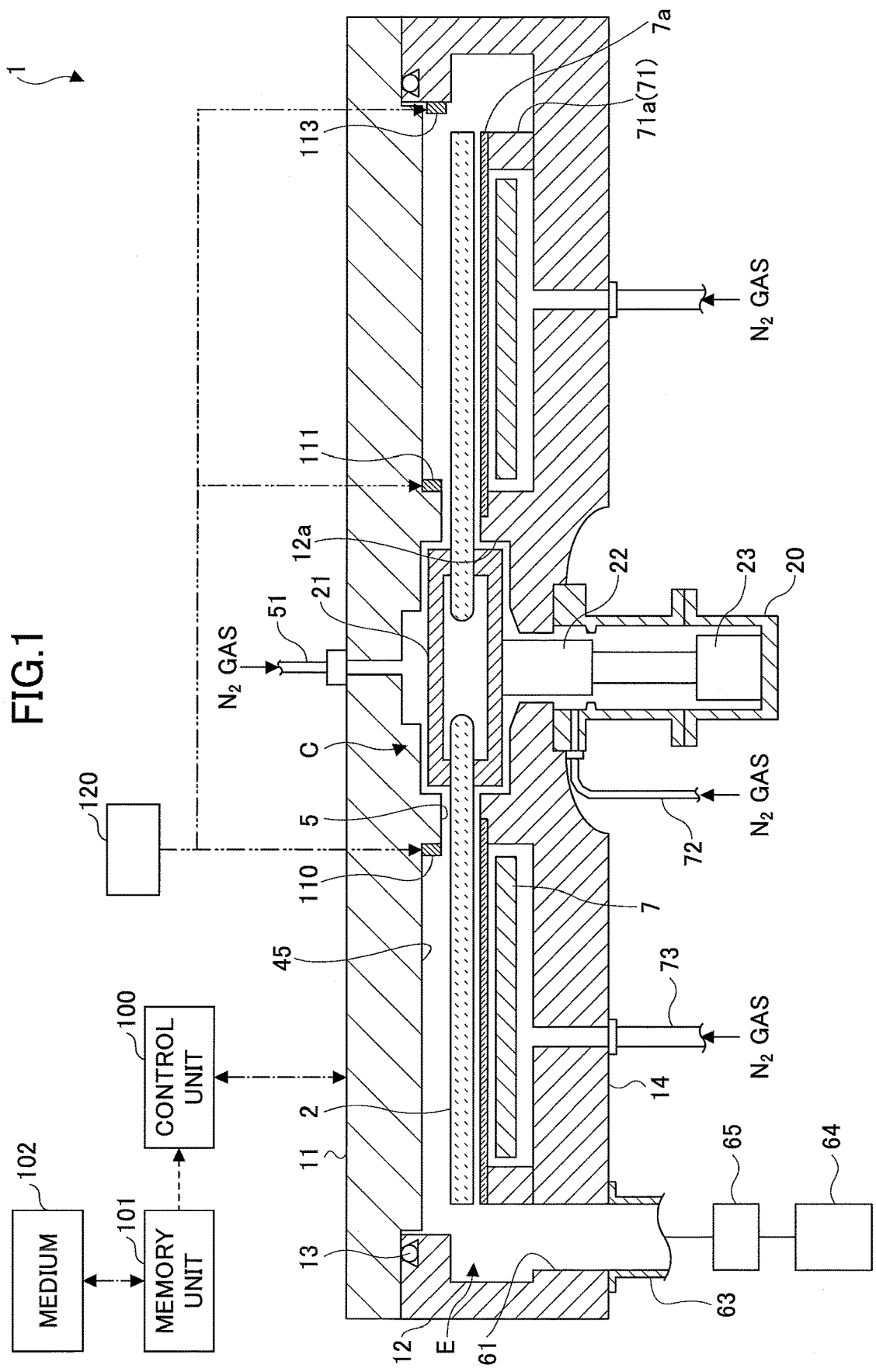
FIG. 1 is a schematic cross-sectional view of a film deposition apparatus according to an embodiment of the present invention.
Figure 2:
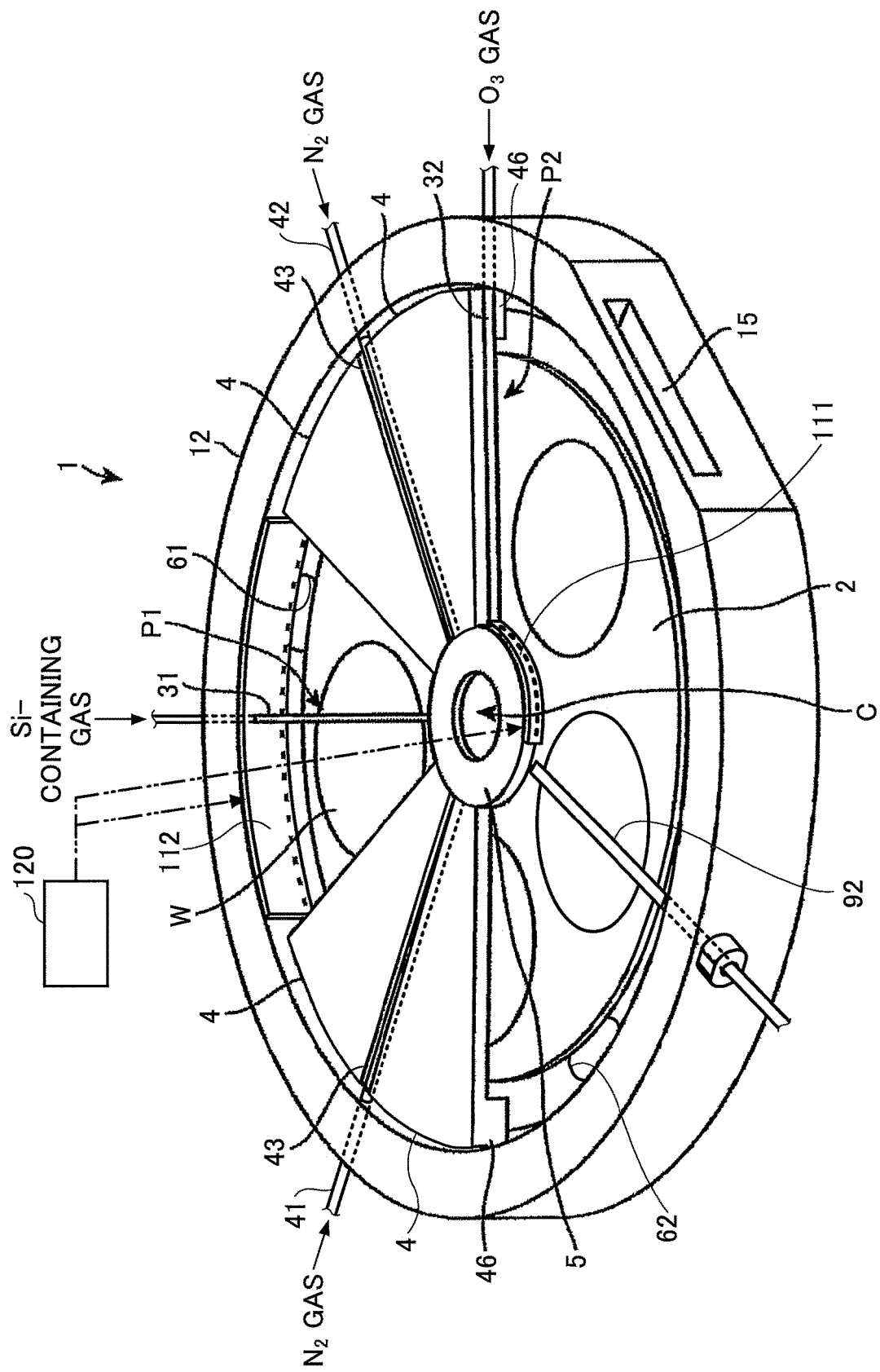
FIG. 2 is a schematic perspective view illustrating a configuration in a vacuum chamber of the film deposition apparatus of FIG. 1.
Figure 3:
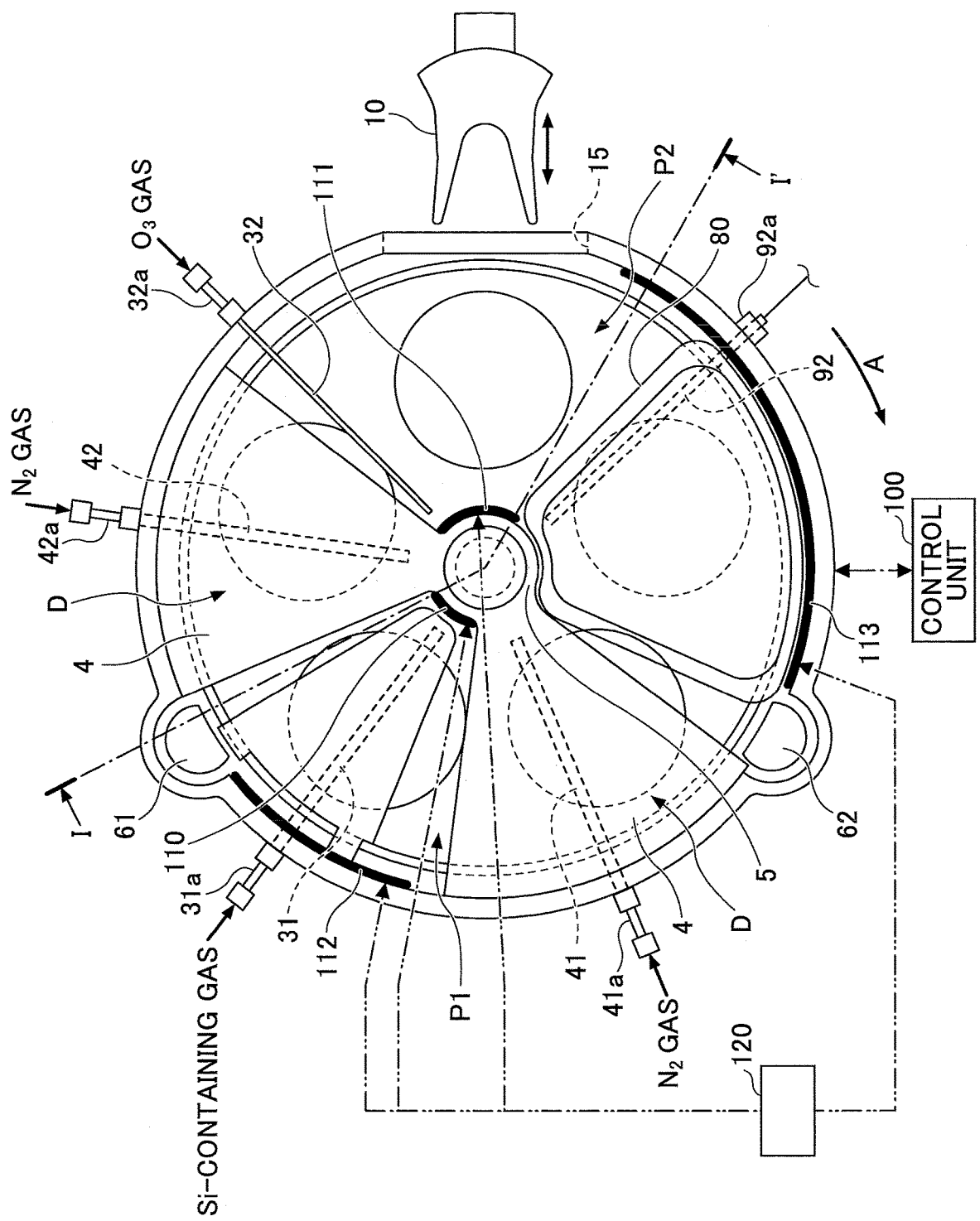
FIG. 3 is a schematic plan view illustrating a configuration in the vacuum chamber of the film deposition apparatus of FIG. 1.

FIG. 1 is a vertical cross-sectional view of an example of a film deposition apparatus according to an embodiment of the present invention. FIG. 2 is an exploded perspective view of an example of the film deposition apparatus according to an embodiment of the present invention. FIG. 3 is a exploded top view of an example of the film deposition apparatus according to an embodiment of the present invention.

With reference to FIGS. 1 through 3, the film deposition apparatus according to an embodiment of the present invention is provided with a vacuum chamber 1 having a flattened cylindrical shape, and a turntable 2 that is located inside the chamber 1 and has a rotational center at a center of the vacuum chamber 1. The vacuum chamber 1 is composed of a chamber body 12 having a cylindrical shape with a closed bottom and a ceiling plate 11 that is detachably placed on the upper end part of the chamber body 12 via a sealing member such as an O ring 13 (see FIG. 1). Because the vacuum chamber 1 is a chamber to process a wafer W thereinside, the vacuum chamber 1 may be also referred to as a process chamber 1.

The turntable 2 is rotatably fixed to a cylindrically shaped core portion 21 at the center part. The core portion 21 is fixed on an upper end of a rotational shaft 22 that extends in a vertical direction. The rotational shaft 22 passes through a bottom part 14 of the chamber body 12 and is fixed at the lower end part to a driving mechanism 23 that can rotate the rotational shaft 22 (see FIG. 1) about the vertical axis. The rotational shaft 22 and the driving mechanism 23 are housed in a case body 20 having a cylinder shape with an opened top. The case body 20 is hermetically fixed to a bottom surface of the bottom part 14, which isolates an inner environment of the case body 20 from an outer environment.

As illustrated in FIGS. 2 and 3, a plurality of (five in the illustrated example) circular concave portions 24, each of which receives a semiconductor wafer W (which is hereinafter referred to as a wafer W), are formed in an upper surface of the turntable 2. The concave portions 24 are located along a circumferential direction. Each of the concave portions 24 has a diameter slightly larger, for example by 4 mm, than the diameter of the wafer W and a depth substantially equal to a thickness of the wafer W. Therefore, when the wafer W is placed in the concave portion 24, a surface of the wafer W is at the same height as a surface of an area of the turntable 2 (on which the wafer is not placed). In the bottom of the concave portion 24 there are formed three through holes (not shown) through which three corresponding lift pins are raised/lowered. The lift pins support a back surface of the wafer W and raise and lower the wafer W.

FIGS. 2 and 3 are diagrams for explaining the structure inside the vacuum chamber, and the ceiling plate 11 is not shown for the sake of explanation. As illustrated in FIGS. 2 and 3, a process gas nozzle 31, a process gas nozzle 32, separation gas nozzles 41, 42, and a gas introduction nozzle 92 are provided above the turntable 2, all of which are made of, for example, quartz glass at predetermined angular intervals along the circumferential direction of the vacuum chamber 1 (or a rotational direction of the turntable (an arrow A in FIG. 3)). In the illustrated example, the gas introduction nozzle 92, the separation gas nozzle 41, the process gas nozzle 31, the separation gas nozzle 42, and the process gas nozzle 32, are arranged in this order from a transfer opening described later in a clockwise fashion. These gas nozzles 92, 31, 32, 41 and 42 penetrate through a circumferential wall part of the chamber body 12 into an inside of the vacuum chamber 1 so as to extend along a radial direction substantially parallel with the turntable 2. The gas nozzles 92, 31, 32, 41 and 42 are supported by attaching their base ends, which are gas introduction ports 92a, 31a, 32a, 41a, 42a, respectively, to the outer circumference of the wall part.

In the film deposition apparatus of the embodiment, the gas introduction nozzle 92 is not necessarily provided, but may be provided as necessary. This means that the gas introduction nozzle 92 is provided when a plasma process is performed in a film deposition process. Hence, as illustrated in FIG. 3 in a simplified manner, a plasma generator 80 is provided above the gas introduction nozzle 92. The plasma generator 80 is described later.

Although not illustrated, the process gas nozzle 31 is connected to a gas supplying source of a silicon(Si)-containing gas as a first reaction gas via a pipe and a flow rate controller and the like (not illustrated). The process gas nozzle 32 is connected to a gas supplying source of an oxidization gas as a second reaction gas via a pipe and a flow rate controller and the like (not illustrated). The separation gas nozzles 41, 42 are connected to a gas supplying source of nitrogen ($N_2$) gas as a separation gas via a pipe and a flow rate controller and the like (not illustrated).

As the Si-containing gas, an organic amino-silane gas can be used, for example, and as the oxidization gas, ozone ($O_3$) gas, oxygen ($O_2$) gas and a mixture of these can be used.

The process gas nozzles 31, 32 have a plurality of discharge holes 33 to discharge the corresponding reaction gases toward the turntable 2. The plurality of discharge holes 33 are arranged in longitudinal directions of the process gas nozzles 31, 32 at predetermined intervals, for example, about 10 mm. An area below the process gas nozzle 31 may be referred to as a first process area P1 in which the Si-containing gas is adsorbed on the wafer W, and an area below the process gas nozzle 32 may be referred to as a second process area P2 in which the Si-containing gas adsorbed on the wafer W is oxidized by the oxidation gas.

With reference to FIGS. 2 and 3, two convex portions 4 are provided in the vacuum chamber 1. Each of the convex portions 4 protrudes from the lower surface of the ceiling plate 11 toward the turntable 2. The concave portions 4 constitute corresponding separation areas D that separate the first process area P1 from the second process area P2, together with the corresponding one of the separation nozzles 41, 42. The convex portion 4 has a top view shape of a truncated sector whose inner arc is coupled to a protrusion part 5 (described later) and whose outer arc lies near and along the inner circumferential wall of the chamber body 12.

As illustrated in FIGS. 1 through 3, especially FIG. 3 as a whole, a side wall heater 112 is provided on an inner side wall surface of the chamber body 12 of the first process area P1, and a side wall heater 110 is provided on an outer side surface of the protrusion part 5 in the first process area P1. Similarly, a side wall heater 113 is provided on the inner side wall surface of the chamber body 12 in the second process area P2, and a side wall heater 111 is provided on the outer side surface of the protrusion part 5 of the second process area P2. The side wall heaters 110 through 113 are heating units provided in order to prevent the first and second process gases supplied from the process gas nozzle 31 and 32, respectively, from decreasing in temperature. The side wall heaters 111 through 113 are heaters fitted into the wall surface provided so as to cover the side wall as indicated by the name, and have a function of heating a space above the turntable 2 of the vacuum chamber 1 from the side surfaces on the central side and the peripheral side of the turntable 2.

The outer side wall heaters 112 and 113 provided on the inner side wall surface of the chamber body 12 may be provided so as to cover a part or a whole (entire inner circumferential surface) of the inner side wall surface of the chamber body 12. In other words, in FIG. 3, while the side wall heater 112 outside the turntable 2 is provided so as to cover substantially the whole inner side wall surface of the chamber body 12 in the process area P1, the side wall heater 113 is provided so as to cover a part of the chamber body 12 in the second process area P2. More specifically, the side wall heater 113 covers the inner side wall surface of a part where the plasma generator 80 is provided. Similarly, while the side wall heater 110 on the central axis side of the turntable 2 is provided so as to cover substantially the whole outer circumferential surface of the protrusion part 5 in the first process area P1, the side wall heater 111 is provided so as to cover only a part where the plasma generator 80 is not provided of the outer circumferential surface of the protrusion part 5. Thus, the side wall heaters 110 through 113 may be selectively provided in an area where the side wall heaters 110 through 113 can be easily installed. In the example of FIG. 3, the side wall heaters 110 and 111 are selectively provided only in areas where the separation area D (convex portion) and the plasma generator are not provided but there is a sufficient space for heater installation on the central side of the turntable 2. In contrast, on the outer peripheral side, the side wall heaters 112 and 113 are provided so as to cover an area where the first process gas nozzle 31 is provided and an area where the plasma generator 80 is provided including the gas introduction nozzle 92.

Any number of the side wall heaters 110 through 113 may be provided at any location depending on a configuration inside the vacuum chamber 1 and an arrangement state of parts. For example, the side wall heaters 110 through 113 may be provided corresponding to areas including the first and second gas nozzles 31 and 32 and the gas introduction nozzle 92 because the side wall heaters 110 through 113 preferably fulfill a function of efficiently heating the process gases supplied into the vacuum chamber 1 in addition to a function of heating the space above the turntable 2. In the example of FIG. 3, the side wall heaters 110, 112 and 113 are provided so as to cover locations where the first process gas nozzle 31 and the gas introduction nozzle 92 are provided to be able to directly heat the process gases supplied from the first process gas nozzle 31 and the gas introduction nozzle 92. In other words, the side wall heaters 110 and 112 are provided so as to include positions of intersection points of the outer circumferential surface of the protrusion part 5 and the inner circumferential surface of the chamber body 12 with an extended line of the first process gas nozzle 31. Moreover, the side wall heater 111 is provided so as to include a position of an intersection point of the outer circumferential surface of the protrusion part 5 with an extended line of the second process gas nozzle 32. Thus, the decrease in gas temperature can be effectively prevented by providing the side wall heaters 110 through 113 in the areas covering the positions intersecting the extended lines of the process gas nozzles 31 and 32 and the gas introduction nozzle 92 that directly introduce the gases into the vacuum chamber 1 in each of the first and second process areas P1 and P2.

In FIG. 3, although only the side wall heater 111 on the central side is provided in the neighborhood of the second process gas nozzle 32, a side wall heater may be also provided at the outer peripheral side in the neighborhood of the second process gas nozzle 32 as necessary.

Furthermore, in FIG. 3, an example is provided of including a pair of the side wall heaters 110 and 112 arranged in pairs at the central side and the peripheral side of the first process area P1 and a pair of the side wall heaters 111 and 114 arranged in pairs at the central side and the peripheral side (though not necessarily facing each other) in the second process area P2. However, by providing a single side wall heater to cover the whole circumference of each side of the central side and the peripheral side, configuring a pair of the side wall heaters covering the whole circumference of both of the outer peripheral surface of the protrusion part 5 and the inner peripheral surface of the chamber body 12 is possible. Because the heating is uniformly performed from both of the central side and the peripheral side through the whole circumference, the space above the turntable 2 can be reliably heated, which makes it possible to prevent the supplied process gases from decreasing in temperature.

The side wall heaters 110 through 113 are preferably provided in an area as large as possible. However, as illustrated in the example of FIG. 3, the side wall heaters 110 through 113 do not have to be provided at a location difficult to be provided due to the presence of the transfer opening 15, the exhaust openings 61 and 62, the convex portions 4 and the like, and may be provided only at a needed location while considering the intended purpose. Moreover, in terms of the efficient heating, the side wall heaters 110 through 113 are preferably provided on both sides of the central side and the peripheral side of the first process area P1 and the second process area P2 in order to heat the space above the turntable 2 so as to sandwich the space between the central side and the peripheral side, but providing the side wall heaters 110 through 113 at only one side of the central side and the peripheral side is possible when side wall heaters 110 through 113 can be provided at only one side due to the structure of the vacuum chamber 1 and the like.

Figure 4:
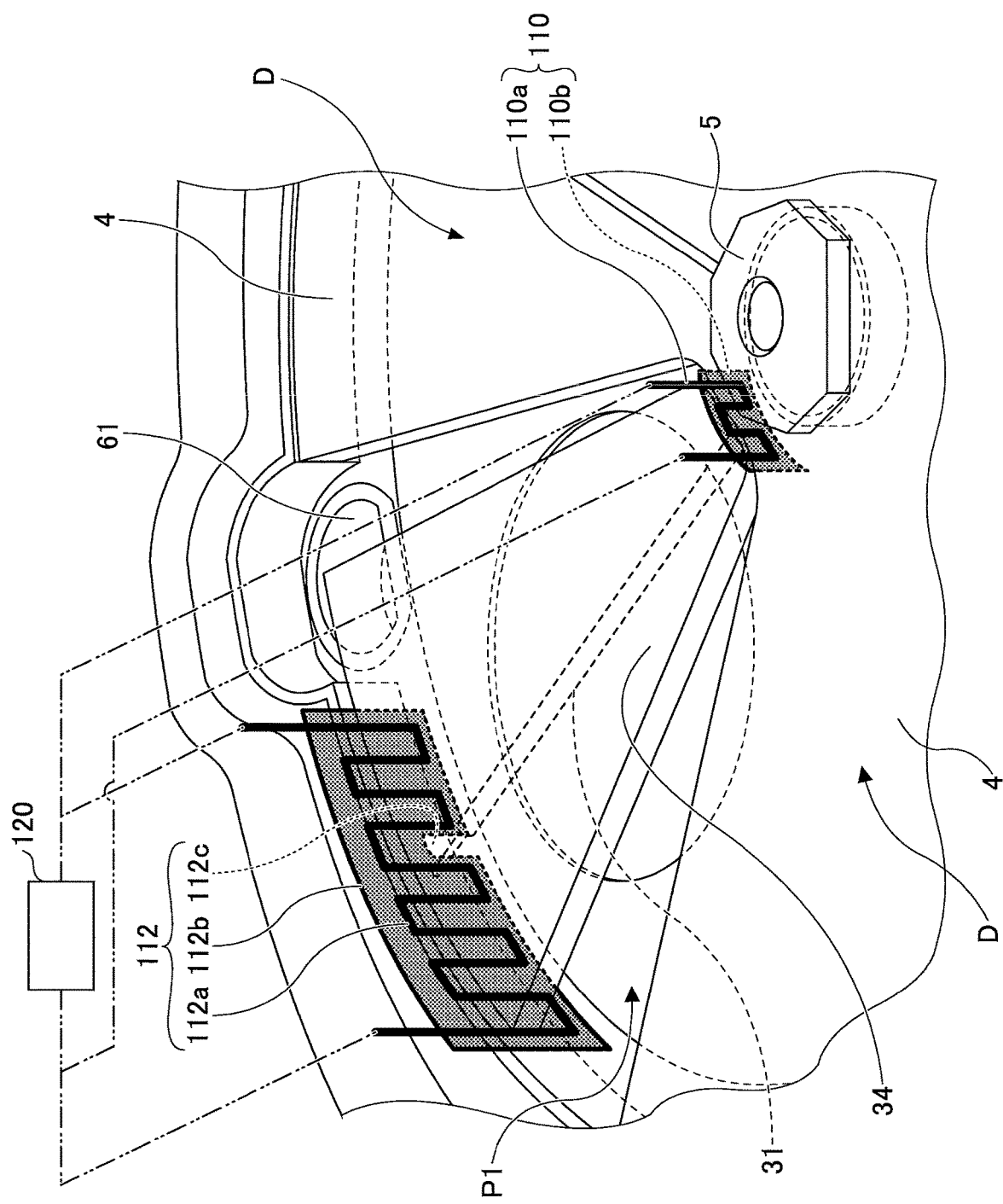
FIG. 4 is a diagram illustrating an example of a side wall heater.

FIG. 4 is a diagram illustrating a structure of an example of the side wall heaters 110 and 112. The side wall heaters 110 and 112 include heating elements 110a and 112a and casings 110b and 112b, respectively. The heating elements 110a and 112a are resistive elements that generate heat by allowing a current to flow therethrough, and are heat generators that generate heat. The heating elements 110a and 112a are preferably arranged so as to cover substantially the whole outer circumferential side surface of the protrusion part 5 and the inner side wall surface of the chamber body 12. For example, as illustrated in FIG. 4, the heating elements 110a and 112a may be configured to have a shape of extending downward first, and then horizontally extending after folding, and further folding and extending upward while extending along the inner circumferential surface of the chamber body 12 as a whole. Also, the heating elements 110a and 112a may have a wavy shape such as an alternating current sine wave, and a zigzag or switchback shape. The heating elements 110a and 112a may be configured to have a variety of arrangements depending on the intended purpose as long as the heating elements 110a and 112a can cover substantially the whole outer circumferential surface of the protrusion part 5 and the inner side wall surface of the chamber body 12.

The casings 110b and 112b are containers to accommodate the heating elements 110a and 112a, and are preferably formed into a shape fitted into the outer circumferential side surface of the protrusion part 5 and the inner side wall surface of the chamber body 12. Preferably, the casings 110b and 112b have a heat resistance property and are made of a material that scarcely generates dust when heated because the casings 110b and 112b are provided in the vacuum chamber 1 to be heated to a temperature of 250 to 600 degrees C., and are required not to contaminate the wafer W to be processed. The casings 110b and 112b may be made of a variety of materials that meet such conditions. For example, the casings 110b and 112b may be made of quartz similarly to the turntable 2.

In FIG. 4, the casing 112b has a cut-out part 112c to allow the first process gas nozzle 31 to be introduced from the outer circumferential wall of the chamber body 12 and extending along the radial direction of the turntable 2. This enables the side wall heater 112 to be provided on the inner side wall surface of the chamber body 12 without preventing the introduction of the first process gas nozzle 31 into the vacuum chamber 1.

Such a cut-out part 112c may be provided in another location as necessary. For example, when a seal member such as an O-ring is used to install the side wall heater 112 or the process gas nozzle 31, the cut-out part 112c may be provided at a location where the seal member is not provided so as not to deteriorate the seal member due to the heat of the side wall heater 112.

As illustrated in FIGS. 1 through 4, a temperature adjustment unit 120 that can adjust temperatures of the side wall heaters 110 through 113 may be provided as necessary. By providing the temperature adjustment unit 120, the temperatures of the side wall heaters 110 through 113 can be adjusted, and can be set at appropriate temperatures depending on a variety of processes. Although FIGS. 1 through 4 illustrate an example of providing a single temperature adjustment part 120 corresponding to the plurality of side wall heaters 110 through 113 and connecting all of the side wall heaters 110 through 113 with the single temperature adjustment part 120, the temperature adjustment part 120 may be individually provided corresponding to each of the side wall heaters 110 through 113.

Setting temperatures of the side wall heaters 110 through 113 may be set at the same temperature, or may be set at different temperatures depending on the provided locations. The setting temperatures of the side wall heaters 110 through 113 can be set at proper temperatures depending on a variety of processes.

The temperature adjustment unit 120 may be formed into a variety of configurations as long as the temperature adjustment unit 120 can adjust the temperatures of the side wall heaters 110 through 113. Moreover, the temperature adjustment unit 120 may be incorporated in the control unit 100 as a part of the control unit 100.

Next, a description is given below of other configurations of the vacuum chamber 1.

Figure 5:
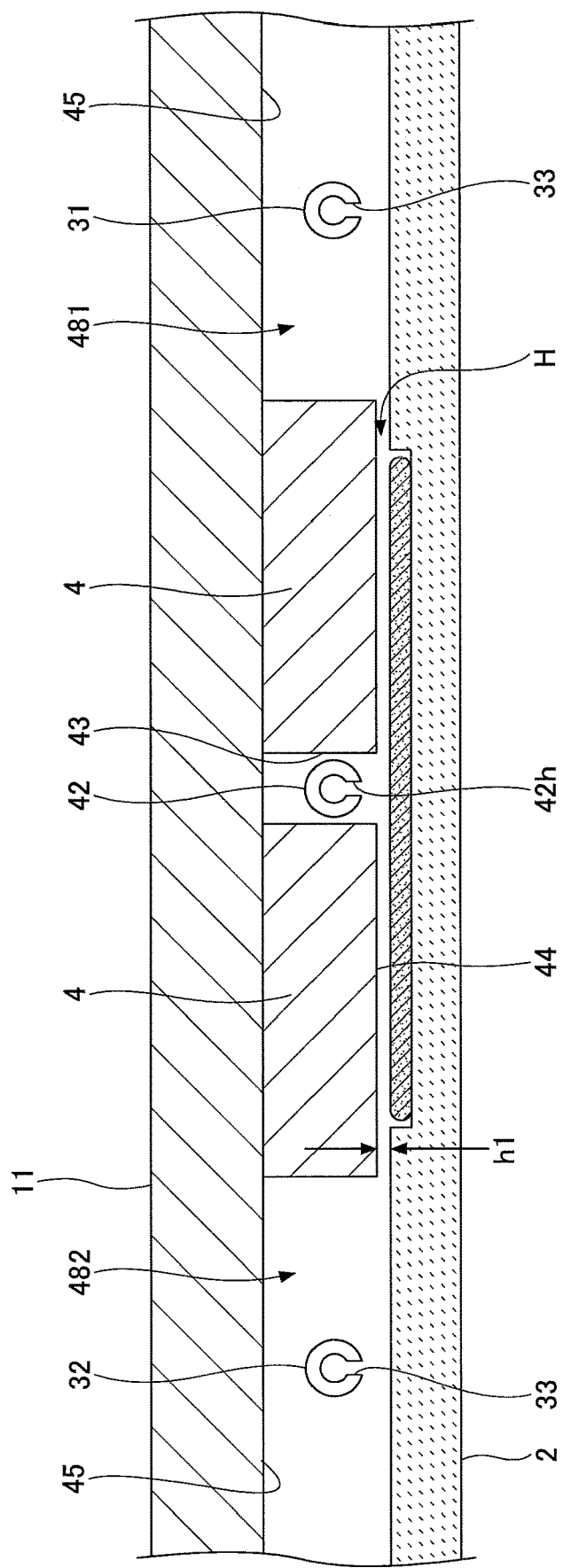
FIG. 5 is a schematic cross-sectional view of the vacuum chamber along a concentric circle of a rotatable turntable provided in the vacuum chamber of the film deposition apparatus of FIG. 1.

FIG. 5 illustrates a cross-sectional view taken along a part of a concentric circle of the turntable 2 from the process gas nozzle 31 to the process gas nozzle 32. As illustrated in FIG. 5, because concave portions 4 are attached to a back surface of the ceiling plate 11, there are flat lower ceiling surfaces 44 (first ceiling surfaces) that are lower surfaces of the convex portions 4, and ceiling surfaces 45 (second ceiling surfaces) that are higher than the ceiling surface 44 and located at both sides of the ceiling surfaces 44 in the circumferential direction. Each of the lower surfaces 44 has a truncated sectorial planner shape. In addition, as illustrated in FIG. 5, the convex portion 4 has a groove portion 43 formed at the center part in the circumferential direction while extending in the radial directions of the convex portions 4. The separation gas nozzle 42 is housed in the groove portion 43. Another convex portion 4 similarly has a groove portion 43 and house the separation gas nozzles 41 therein. In addition, the process gas nozzles 31, 32 are arranged below the higher ceiling surfaces 45. Specifically, the process gas nozzles 31, 32 are arranged apart from the higher ceiling surfaces and near the upper surface of the wafer W or the turntable 2. As illustrated in FIG. 5, the process gas nozzle 31 is provided in right-hand space 471 under the higher ceiling surface 45, and the process gas nozzle 32 is provided in left-hand space 482 under the higher ceiling surface 45.

The separation gas nozzles 41, 42 housed in the groove portions 43 have a plurality of discharge holes 42h (see FIG. 5) open toward the turntable 2. The plurality of discharge holes 42h are arranged in longitudinal directions of the separation gas nozzles 41, 42 at predetermined intervals, for example, about 10 mm.

The lower ceiling surfaces 44 create a separation space H, which is a narrow space relative to the upper surface of the turntable 2. When $N_2$ gas is supplied from the discharge holes 42h of the separation gas nozzle 42, supplied $N_2$ gas flows toward the spaces 481, 482 through the separation space H. At this time, because a volume of the separation space H is smaller than volumes of the spaces 481, 482, a pressure of the separation space H through which the $N_2$ gas flows can be higher than pressures of the spaces 481, 482. Hence, a pressure wall can be created between the spaces 481, 482 as the separation space H. In addition, $N_2$ gas flowing from the separation space H to the spaces 481, 482 serves as a counter flow against the Si-containing gas from the first process area P1 and the oxidization gas from the second process area P2. Accordingly, the Si-containing gas from the first process area P1 and the oxidization gas from the second process area P1 are separated by the separation space H. Thus, the Si-containing gas and the oxidization gas are prevented from being intermixed and reacting with each other in the vacuum chamber 1.

It is preferable to set the height h1 of the ceiling surface 44 with respect to the upper surface of the turntable 2 to be a height that can make the pressure in the separation space H to be higher than the pressure of the spaces 481 and 482 in consideration of the pressure in the vacuum chamber when depositing a film, rotation speed of the turntable 2, and the supply amount of the separation gas ($N_2$ gas).

As shown in FIGS. 2 and 3, a ring-shaped protrusion portion 5 is provided on a lower surface of the ceiling plate 11 so as to surround the outer circumference of the core portion 21 fixing the turntable 2. In this embodiment, the protrusion portion 5 continues to a part of the convex portion 4 at the side of the rotational center, and a lower surface of the protrusion portion 5 is formed to have the same height as the lower surface of the ceiling surface 44. In other words, the lower surface of the protrusion portion 5 and the lower surface of the convex portion 4 form one plane surface.

Figure 6:
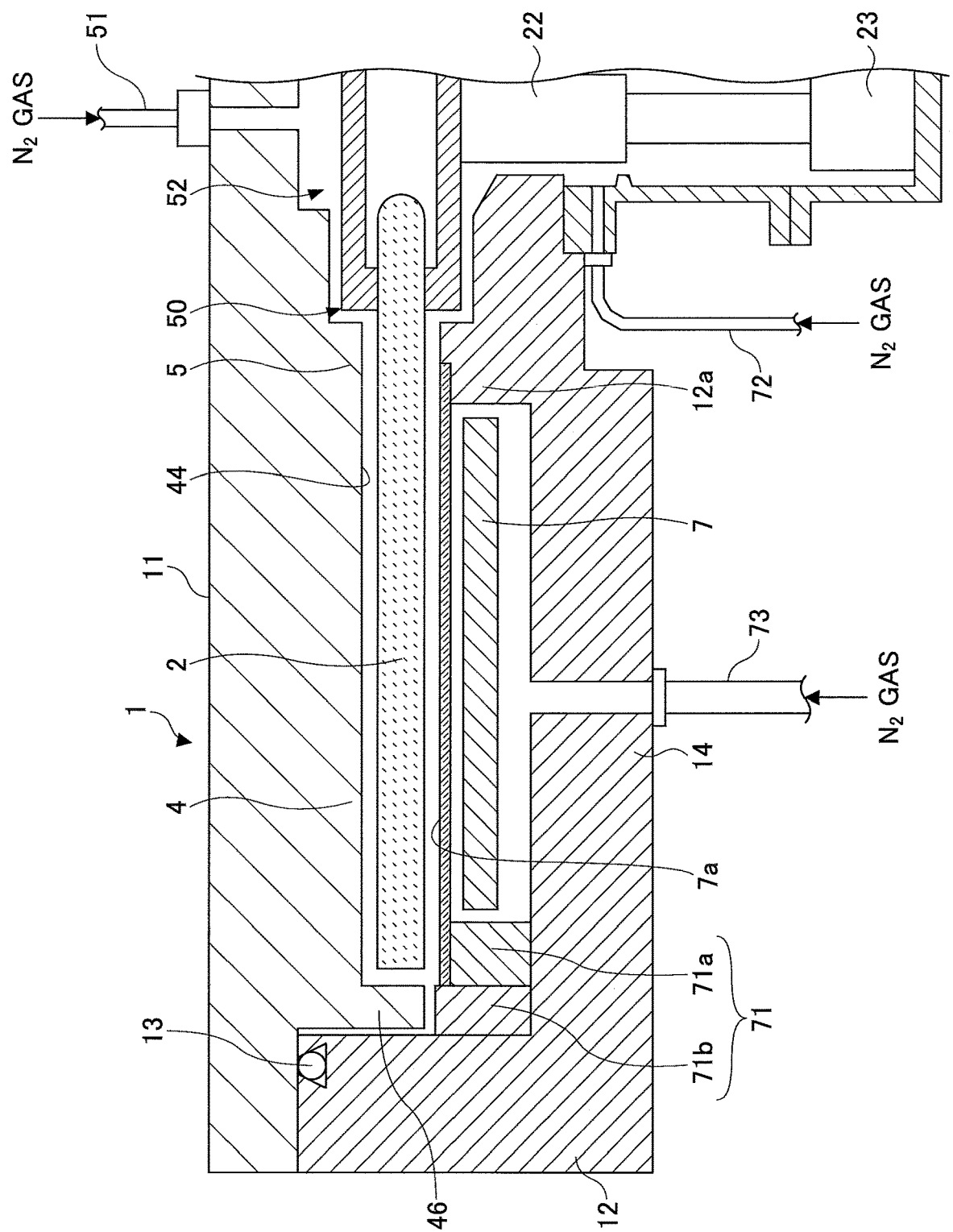
FIG. 6 is another schematic cross-sectional view of the film deposition apparatus of FIG. 1.

FIG. 5 is a cross-sectional view illustrating a part of the vacuum chamber 1 where the lower ceiling surface 44 is provided, while FIG. 1 illustrates a cross-sectional view taken along I-I' line of FIG. 3, where the higher ceiling surface 45 is provided. As illustrated in FIG. 6, a bent portion 46 bent into an L shape is provided at the outer peripheral part of the sectorial convex portion 4 (location at outer peripheral side of the vacuum chamber 1) so as to face the outer circumference of the turntable 2. The bent portion 46 prevents the process gases from being intermixed by preventing the process gases from entering from both sides of the separation areas D as well as the convex portions 4. Because the convex portion 4 is attached on the lower surface of the ceiling plate 11, which can be removed from the chamber body 12, there needs to be a clearance between an outer circumferential wall of the bent portion 46 and the inner circumferential wall of the chamber body 12. A clearance between an inner circumferential surface of the bent portion 46 and an outer circumferential surface of the turntable 2 and the clearance between an outer circumferential wall of the bent portion 46 and the inner circumferential surface of the chamber body 12 is, for example, set to be the same as the height h1 of the lower ceiling surface 44 with respect to the upper surface of the turntable 2.

As illustrated in FIG. 6, while the inner circumferential wall of the chamber body 12 is formed into a vertical surface closer to the outer circumferential surface of the bent portion 46 in the separation area D, the inner circumferential wall of the chamber body 12 is recessed outwards in a region from a location opposing the outer circumference of the turntable 2 to the bottom part 14 of the chamber body 12 in an area except for the separation area D, as illustrated in FIG. 1. In the following description, the recessed part having substantially a rectangular cross-sectional shape may be referred to as an evacuation area, for the sake of explanation. Specifically, an evacuation area that is in communication with the first process area P1 is referred to as a first evacuation area E1; and an evacuation area that is in communication with the second process area P2 is referred to as a second evacuation area E2. In bottom parts of the first evacuation area E1 and the second evacuation areas E2, a first evacuation port 61 and a second evacuation port 62 are formed, respectively, as illustrated in FIGS. 1 through 3. Each of the first evacuation port 61 and the second evacuation port 62 is connected to a vacuum pump 64 serving as an evacuation apparatus via an evacuation pipe 63, as illustrated in FIG. 1. Incidentally, as illustrated in FIG. 1, a pressure controller 65 is connected to the evacuation pipe 63.

As illustrated in FIGS. 1 and 6, a heater unit 7 serving as a heating means is provided in a space between the turntable 2 and the bottom part 14 of the chamber body 12 so as to heat the wafers W placed on the turntable 2 through the turntable 2 up to a temperature (e.g., 450° C.) specified in a process recipe. In addition, a ring-shaped cover member 71 is provided below and near the outer circumference of the turntable 2 in order to separate an atmosphere of the space where the heater unit 7 is placed from an atmosphere of a region from a space above the turntable 2 to the evacuation area, thereby preventing gases from entering the space under the turntable 2 (see FIG. 6). Specifically, the cover member 71 includes an inner member 71a and an outer member 71b. The inner member 71a is arranged below and along the peripheral area of the turntable 2 so as to reach even an area beyond the periphery of the turntable 2, and the outer member 71b is arranged between the inner member 71a and the inner circumferential surface of the chamber body 12. Specifically, the outer member 71b is provided under the bent portion 46 formed in the peripheral part of the convex portions 4 in the separation areas D and close to the bent portion 46. The inner member 71a surrounds the entire space where the heater unit 7 is placed by being provided at the peripheral part under the turntable 2 (and in the area below the turntable 2 slightly beyond the periphery of the turntable 2).

When the heating performed by the heater unit 7 provided under the turntable 2 can prevent the gases supplied from the first and second process gas nozzles 31 and 32 and the gas introduction nozzle 92 from decreasing in temperature and the uniformity of a deposited film across the surface of the wafer W can be ensured, the side wall heaters 110 through 113 are not necessarily provided. However, because the first and second process gas nozzles 31 and 32 and the gas introduction nozzle 92 are disposed above the turntable 2, the gases supplied from the first and second process gas nozzle 31 and 32 and the gas introduction nozzle 92 may not be sufficiently heated only by the heating from the heater unit 7, which may cause the decrease of the gas temperatures. Therefore, in the embodiment, the side wall heaters 110 through 113 are provided in addition to the heater unit 7 provided under the turntable 2 so as to sufficiently heat the supplied gas, thereby reliably improving the uniformity of the deposited film across the surface of the wafer W.

The bottom part 14, at a location closer to the rotational center than the space including the heater unit 7, includes a protrusion part 12a that protrudes toward the core portion 21 arranged near the center of the lower surface of the turntable 2. A narrow space is formed between the protrusion part 12a and the core portion 21. In addition, there is formed a narrow gap between the rotational shaft 22 and the inner circumferential surface of a through hole that allows the rotational shaft 22 to pass therethrough. The narrow space and the narrow gap are in communication with the case body 20. A purge gas supplying pipe 72 is connected with the case body 20 to supply $N_2$ gas, which is a purge gas, into the case body 20 in order to purge the inside of the case body 20, the gap, and the narrow space. In addition, a plurality of purge gas supplying pipes 73 are provided in the bottom part 14 of the vacuum chamber 1 in areas under the heater unit 7 at predetermined angular intervals in order to purge the space where the heater unit 7 is placed. Incidentally, only one purge gas supplying pipe 73 is illustrated in FIG. 6 for the sake of illustration. In addition, a lid member 7a having a ring shape is provided between the turntable 2 and the heater unit 7. The lid member 7a covers from the inner circumferential wall of the outer member 71b (upper surface of the inner member 71a) to the top end of the protrusion part 12a throughout the whole circumference to prevent the process gases from entering the area including the heater unit 7. The lid member 7a is made of, for example, quartz glass.

In addition, a separation gas supplying pipe 51 is connected to the top center portion of the ceiling plate 11 of the vacuum chamber 1, so that $N_2$ gas as a separation gas is supplied to a space 52 between the ceiling plate 11 and the core portion 21. The separation gas supplied to the space 52 flows through a narrow gap 50 between the protrusion portion 5 and the turntable 2 and then along the upper surface of the turntable 2 toward the outer circumference of the turntable 2. The narrow space 50 can be maintained by $N_2$ gas at a pressure higher than pressures in the spaces 481, 482. Therefore, the Si-containing gas supplied to the first process area P1 and the oxidization gas supplied to the second process area P2 are prevented from being intermixed with each other through the center area C by the narrow space 50 maintained at a higher pressure. In other words, the narrow space 50 (or the center area C) functions in the same manner as the separation space H (or the separation area D).

In addition, a transfer opening 15 is formed in a side wall of the chamber body 12 as shown in FIGS. 2 and 3. Through the transfer opening 15, the wafer W is transferred into or out of the vacuum chamber 1 by a transfer arm 10. The transfer opening 15 is provided with a gate valve (not illustrated) by which the transfer opening 15 is opened or closed. When the concave portion 24 of the turntable 2 is in alignment with the transfer opening 15 and the gate valve is opened, the wafer W is transferred into the vacuum chamber 1 and placed in the concave portion 24 that is a wafer receiving portion of the turntable 2 from the transfer arm 10. In order to lower/raise the wafer W into/from the concave portion 24, there are provided lift pins that are raised or lowered through corresponding through holes formed in the concave portion 24 of the turntable 2 by a lifting mechanism (not illustrated).

Figure 7:
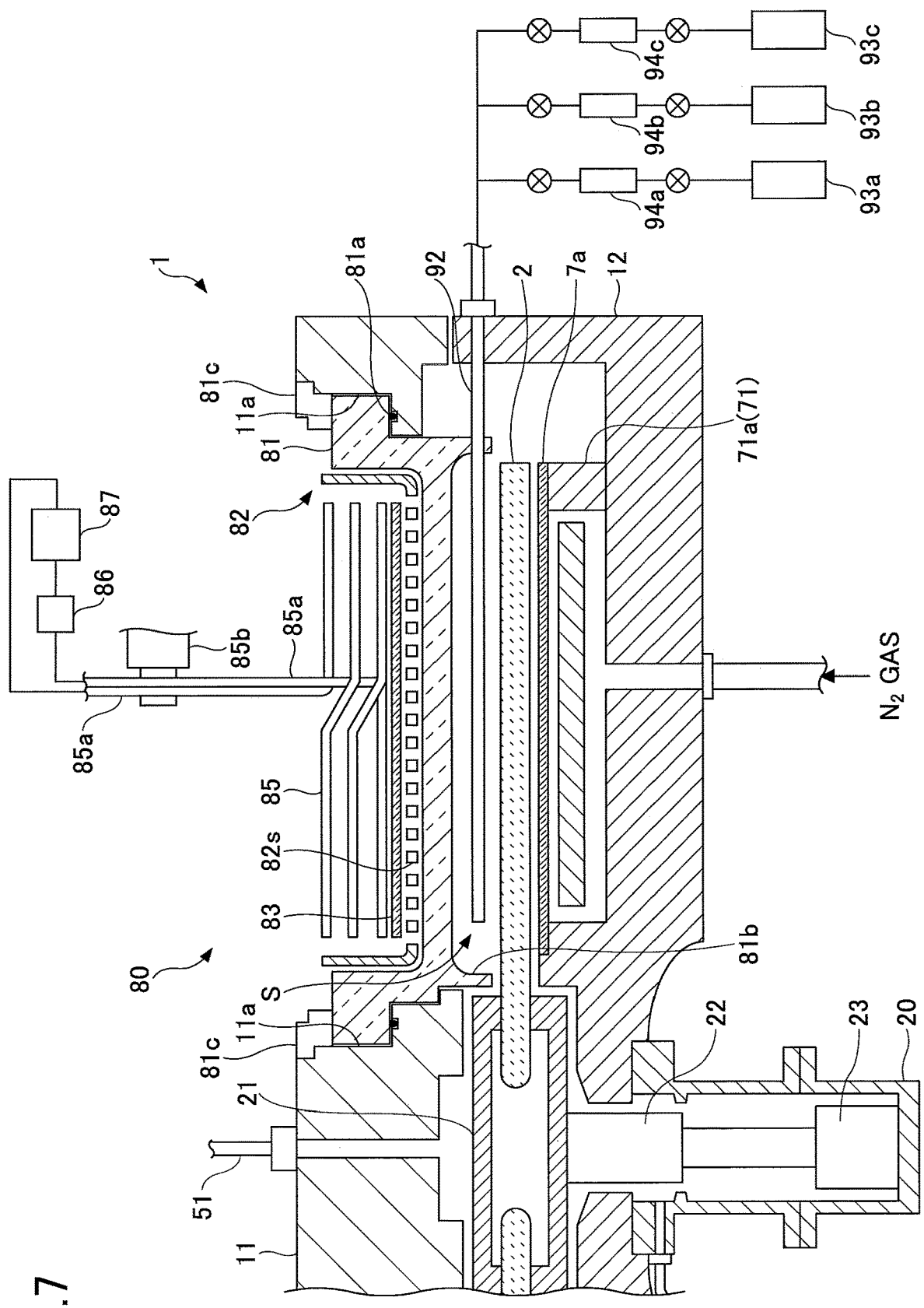
FIG. 7 is a schematic cross-sectional view illustrating a plasma generator provided in the film deposition apparatus of FIG. 1.
Figure 8:
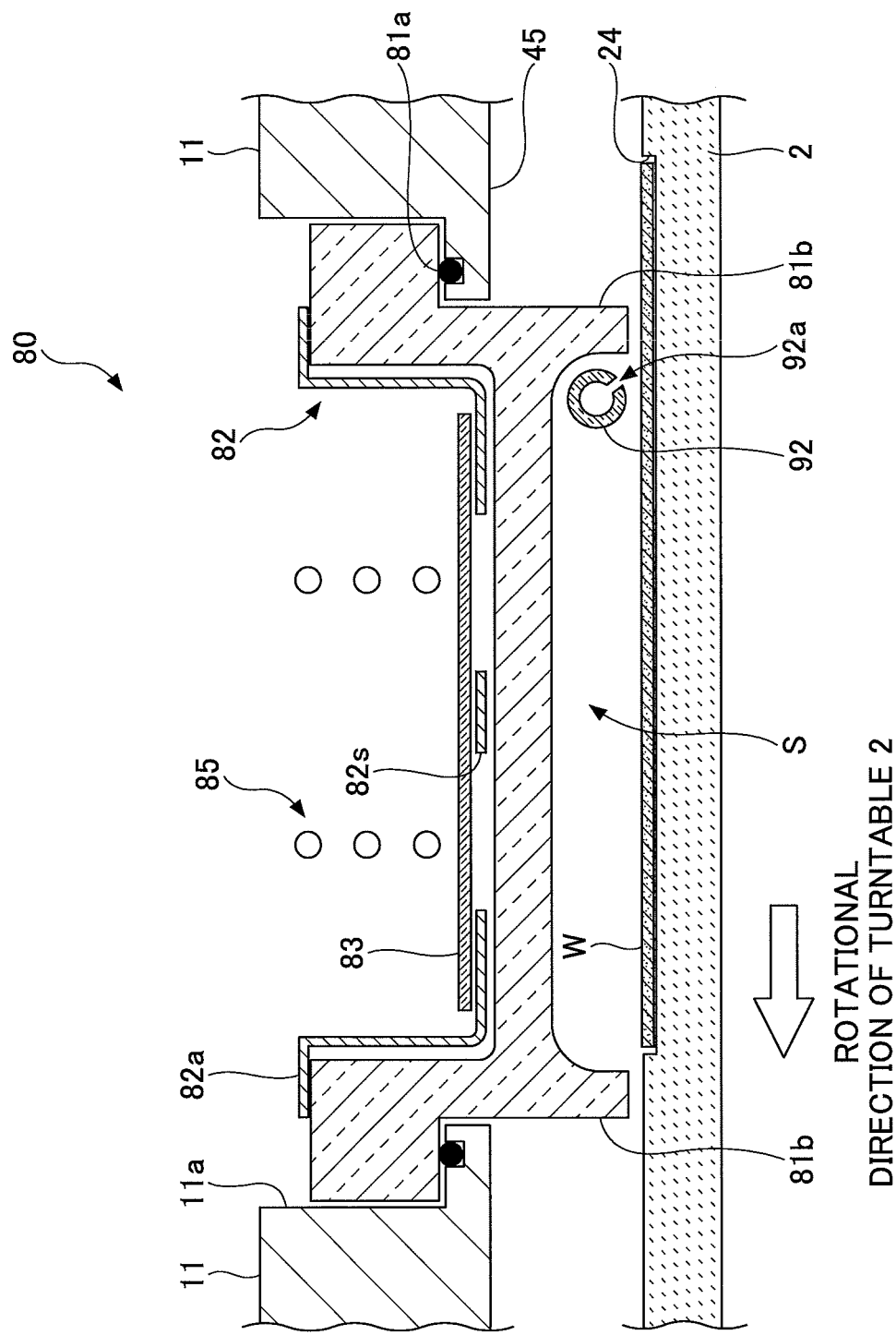
FIG. 8 is another schematic cross-sectional view illustrating a plasma generator provided in the film deposition apparatus of FIG. 1.
Figure 9:
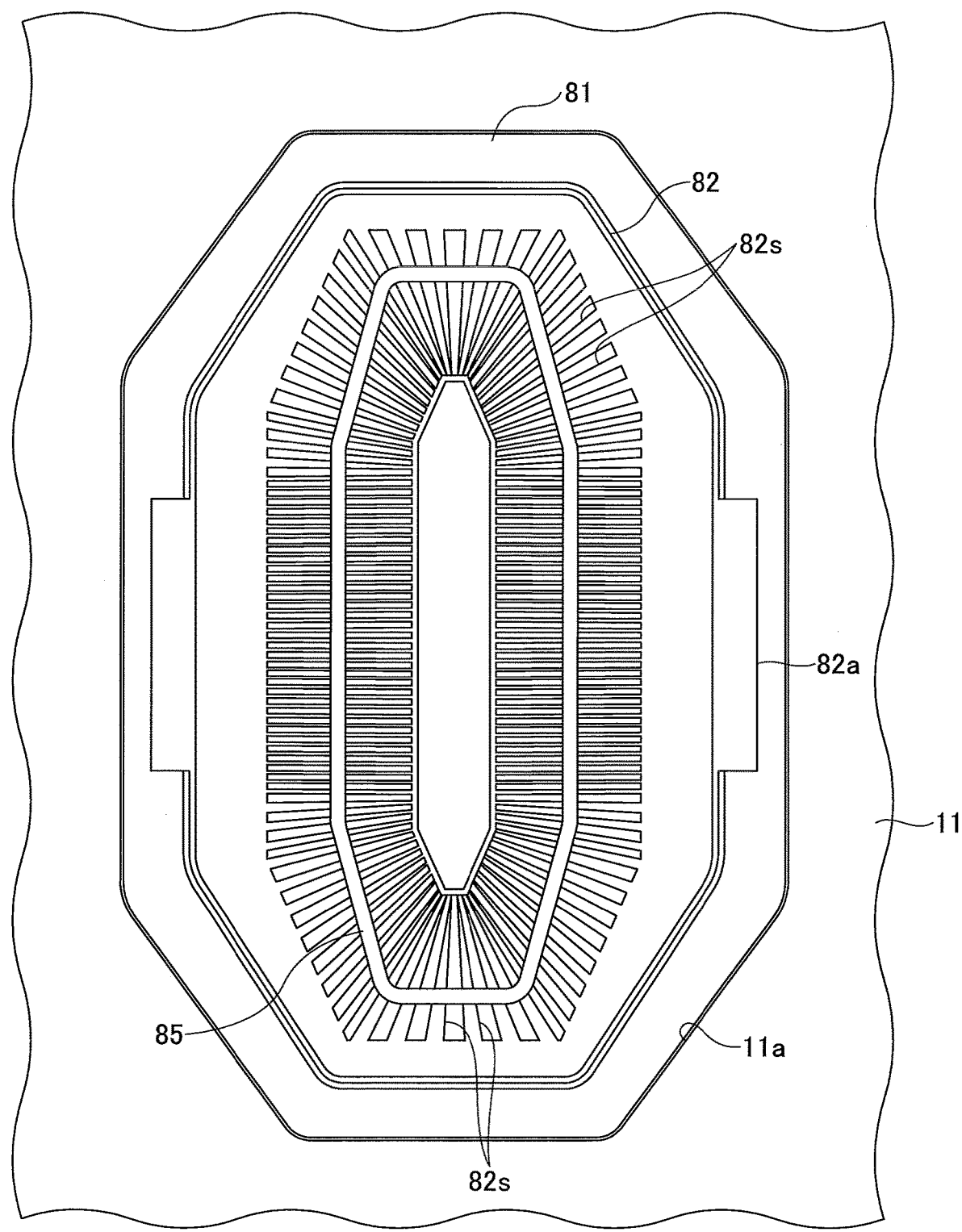
FIG. 9 is a schematic top view illustrating a plasma generator provided in the film deposition apparatus of FIG. 1.

Next, the plasma generator 80 is described with reference to FIGS. 7-9. The plasma generator 80 is not a required element in the film deposition apparatus of the embodiment, but may be provided as necessary. FIG. 7 is a schematic cross-sectional view of the plasma generator 80 along the radial direction of the turntable 2. FIG. 8 is a schematic cross-sectional view of the plasma generator 80 along the direction perpendicular to the radial direction of the turntable 2. FIG. 9 is a schematic top view of the plasma generator 80. For the sake of convenience of drawing, a part of the members is omitted in these figures.

With reference to FIG. 7, the plasma generator 80 is made of a high-frequency wave transmissible material, and includes: a frame member 81 that has a concave part recessed from the upper plane and that is engaged in an opening part 111a formed on the ceiling plate 11; a Faraday shielding plate 82 that is accommodated in a concave part of the frame member 81 and that has an almost-box shape having an opening on the upper part; and an insulating plate 83 placed on the bottom surface of the Faraday shielding plate 82, and a coil-like antenna 85 that is supported above the insulating plate 83 and that has an almost octagonal-shaped upper surface shape when viewed from the top.

The opening part 11a of the ceiling plate 11 includes a plurality of step parts. One of the step parts is provided with a groove part around the whole circumference. A sealing member 81a such as an O-ring, for example, is fitted into the groove part. The frame member 81 includes a plurality of step parts corresponding to the step parts of the opening part 11a. The frame member 81 is fitted into the opening part 11a so that a back side of a step part of the plurality of step parts contacts the seal member 81a fitted in the groove part of the opening part 11a. Accordingly, airtightness between the ceiling plate 11 and the frame member 81 is maintained. Also, as illustrated in FIG. 7, a pressing member 81c is provided along the outer circumference of the frame member 81 fitted in the opening part 11a of the ceiling plate 11. Accordingly, the frame member 81 is pressed downward to the ceiling plate 11. Accordingly, airtightness between the ceiling plate 11 and the frame member 81 is maintained more securely.

The lower surface of the frame member 81 is opposite to the turntable 2 in the vacuum chamber 1. A projection part 81b that projects downward is provided around the whole outer circumference of the lower surface. The lower surface of the projection part 81b is provided near the surface of the turntable 2, so that a space (to be referred to as an internal space S) is formed above the turntable 2 by the projection part 81b, the surface of the turntable 2, and the lower surface of the frame member 81. The interval between the lower surface of the projection part 81b and the surface of the turntable 2 may be almost the same as the height h1 of the ceiling surface 11 with respect to the upper surface of the turntable 2 in the separation space H (see FIG. 4).

The gas introduction nozzle 92 that passes through the projection part 81b extends into the internal space S. In the present embodiment, as illustrated in FIG. 7, an argon gas supply source 93a in which argon (Ar) gas is filled, an oxygen gas supply source 93b in which oxygen ($O_2$) gas is filled, and an ammonium gas supply source 93c in which ammonium ($NH_3$) gas is filled are connected to the gas introduction nozzle 92. Flow rates of Ar gas, $O_2$ gas and $NH_3$ gas from the argon gas supply source 93a, the oxygen gas supply source 93b and the ammonium gas supply source 93c are controlled by flow rate controllers 94a, 94b and 94c, respectively, and the flow-controlled gasses are supplied to the internal space S at a predetermined flow rate ratio (mixture ratio). Here, the gases supplied to the gas introduction nozzle 92 are only an example, and a variety of appropriate process gases can be used depending on processes.

The gas introduction nozzle 92 is provided with a plurality of discharge holes 92h at predetermined intervals (10 mm, for example) along the lengthwise direction thereof. The above mentioned gasses are discharged from the discharge holes 92h. As illustrated in FIG. 8, the discharge hole 92h is inclined toward the upstream side of the rotation direction of the turntable 2 with respect to a direction perpendicular to the turntable 2. Therefore, the gas supplied from the gas introduction nozzle 92 is discharged in a direction opposite to the rotational direction of the turntable 2. More specifically, the gas is discharged toward a gap between the lower surface of the projection part 81b and the surface of the turntable 2. Accordingly, the process gas or the separation gas is prevented from flowing into the inside space S from the space below the ceiling surface 45 that is placed at the upstream side along the rotational direction of the turntable 2 with respect to the plasma generator 80. Also, as mentioned above, because the projection part 81b that is formed around the outer periphery of the lower surface of the frame member 81 is close to the surface of the turntable 2, the gas output from the gas introduction nozzle 92 can easily keep the pressure in the inside space S high. According to this feature, the process gas and the separation gas are prevented from flowing into the inside space S.

The Faraday shielding plate 82 is made of conductive material such as a metal, and the Faraday shielding plate 82 is grounded (although not shown in the figure). As clearly illustrated in FIG. 9, a plurality of slits 82s are formed in the bottom part of the Faraday shielding plate 82. Each of the slits 82s extends in a direction almost perpendicular to a corresponding side of the antenna 85 having the almost octagonal plane shape.

Also, as illustrated in FIGS. 8 and 9, the Faraday shielding plate 82 includes holding parts 82a bent outwards at two upper end portions. The holding parts 82a are supported on the upper surface of the frame member 81 so that the Faraday shielding plate 82 is supported at a predetermined position in the frame member 81.

The insulating plate 83 is made of quartz glass, for example, and is slightly smaller than the bottom plane of the Faraday shielding plate 82. The insulating plate 83 is placed on the bottom plane of the Faraday shielding plate 82. The insulating plate 83 provides electrical insulation between the Faraday shielding plate 82 and the antenna 85, and on the other hand, the insulating plate 83 transmits the high-frequency wave emitted from the antenna 85 downward.

The antenna 85 is formed by winding a copper pipe three times, for example, such that the planar shape becomes almost octagonal. Cold water can be circulated in the pipe. Accordingly, the antenna 85 is prevented from being heated by the high-frequency wave supplied to the antenna 85. Also, a standing part 85*a* is provided at both ends of the antenna 85, and a supporting part 85*b* is attached to the standing part 85*a*. The supporting part 85*b* keeps the antenna 85 at a predetermined position in the Faraday shielding plate 82. Also, a high-frequency power source 87 is connected to the supporting part 85*b* via a matching box 86. The high-frequency power source 87 can generate a high-frequency wave having a frequency of 13.56 MHz, for example.

According to the plasma generator having the above-mentioned structure, the high-frequency power is supplied to the antenna 85 from the high-frequency power source 87 via the matching box 86, so that the antenna 85 generates an electromagnetic field. The electric field component in the electromagnetic field is shielded by the Faraday shielding plate 82. Thus, the electric field component cannot propagate downward. On the other hand, the magnetic field component propagates into the inner space S through a plurality of slits 82*s* of the Faraday shielding plate 82. By the magnetic field component, plasma is generated from the gases such as Ar gas, $O_2$ gas and $NH_3$ gas supplied to the inner space S at a predetermined flow rate ratio (mixture ratio) from the gas introduction nozzle 92. The generated plasma can decrease damage of a thin film deposited on the wafer W due to irradiation, and damages of each member in the vacuum chamber 1.

Figure 10A:
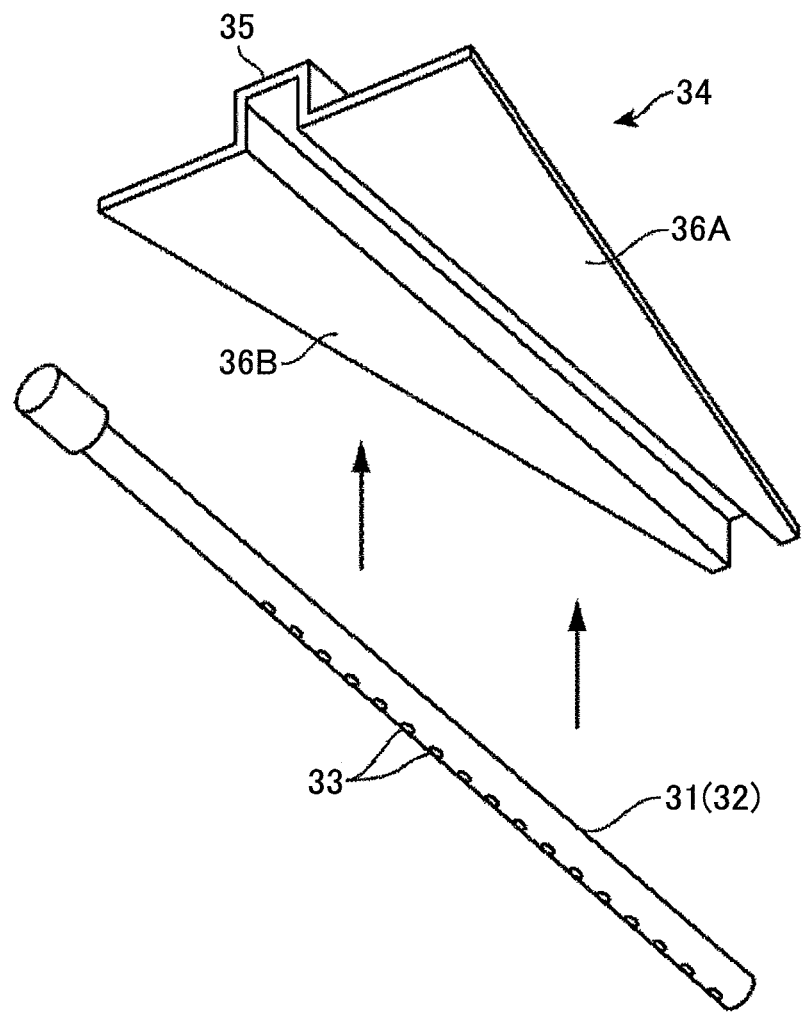
FIGS. 10A and 10B are diagrams illustrating an example of a configuration of a nozzle cover of a film deposition apparatus according to an embodiment of the present invention.
Figure 10B:
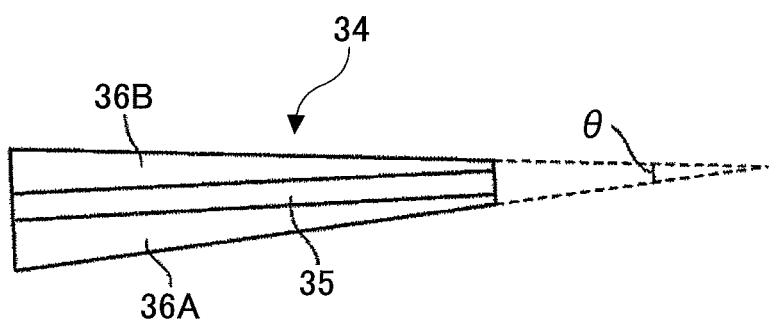

Next, with reference to FIGS. 10A and 10B, a description is given below of a nozzle cover 34 provided as necessary. FIGS. 10A and 10B are diagrams illustrating a configuration of an example of a nozzle cover. FIG. 10A illustrates the nozzle cover 34 to be attached to each of the process gas nozzles 31 and 32. The nozzle cover 34 is not a required element for the film deposition apparatus according to the embodiments, but may be provided as necessary. The nozzle cover 34 is provided to supply the process gas to the wafer W (turntable 2) at higher density. As illustrated in FIG. 10A, the nozzle cover 34 includes a base part 35 extending along the lengthwise directions of the process gas nozzle 31 (32) and having a cross section of an angular C-letter shape. The base part 35 is disposed to cover the process gas nozzle 31 (32). A flow regulatory plate 36A and a flow regulatory plate 36B are attached to one and the other, respectively, of two opening ends of the base part 35 extending in the above-described lengthwise directions.

FIG. 10B is a diagram illustrating an example of a proportional relationship between elements of the nozzle cover 34. As illustrated in FIG. 10B, in this embodiment, the flow regulatory plates 36A and 36B are formed symmetrically with respect to the center axis of the process gas nozzle 31 (32). Furthermore, the length of each of the flow regulatory plates 36A and 36B along the rotational direction of the turntable 2 increases toward the peripheral part of the turntable 2. Therefore, the nozzle cover 34 has a substantially sectorial planar shape. Here, the opening angle θ of the sector indicated by dotted lines in FIG. 10B, which is determined in consideration of the size of the projecting part 4 of the separation region D1 (D2) as well, is preferably, for example, more than or equal to 5° and less than 90°, and more preferably, for example, more than or equal to 8° and less than 10°. By providing such a nozzle cover 34, the contact time of the process gas supplied from the process gas nozzle 31, 32 with the wafer W can be made longer, and the adsorption of the process gas on the surface of the wafer W can be performed efficiently. Hence, the nozzle cover 34 may be provided at either or both of the process gas nozzles 31 and 32 as necessary.

As illustrated in FIG. 1, the film deposition apparatus of the present embodiment is provided with a control part 100 that includes a computer for controlling operation of the whole apparatus. A memory of the control unit 100 stores a program for causing the film deposition apparatus to perform an after-mentioned film deposition method. Such a program includes a group of steps for carrying out the film deposition method, and is installed into the control unit 100 from a computer readable storage medium 102 such as a hard disk, a compact disc, a magneto optical disk, a memory card, a flexible disk, or the like, after being read to a memory part 101.

Moreover, as illustrated in FIG. 1, the side wall heaters 110 and 111 are provided on the outer circumferential side surface of the protrusion portion 5, and the side wall heater 113 is provided on the inner circumferential wall of the chamber body 12. The temperature adjustment unit 120 to control the temperatures of the side wall heaters 110, 111 and 113 is electrically connected to the side wall heaters 110, 111 and 113.

Next, a film deposition method according to an embodiment of the present invention is explained using an example carried out by the above-mentioned film deposition apparatus 1 with reference to figures.

First, the gate valve (not shown) is opened, and the wafer W is transferred into the concave portion 24 of the turntable 2 through the transfer opening 15 by the transfer arm 10. The transfer of the wafer W is performed by causing the lift pins (not illustrated) to move up and down from the bottom side of the vacuum chamber 1 through the through holes in the bottom surface of the concave portion 24 when the concave portion stops at a position opposite to the transfer opening 15. Such transfer of the wafer W is performed by intermittently rotating the turntable 2, and each wafer W is placed on each of the five concave portions 24 of the turntable 2.

Next, the gate valve is closed, and the vacuum chamber is evacuated by the vacuum pump 64 up to the lowest reachable pressure. After that, $N_2$ gas that is the separation gases is supplied from the separation gas nozzles 41, 42 at a predetermined flow rate, and $N_2$ gas is also supplied from the separation gas supplying pipe 51 and the purge gas supplying pipes 72, 73 at predetermined flow rates. Then, a pressure inside the vacuum chamber 1 is adjusted to a predetermined pressure by the pressure controller 65. Next, the wafers W on the turntable 2 are heated to a predetermined temperature, for example, 450 degrees C. by the heater unit 7, while rotating the turntable 2 in a clockwise fashion when seen from above at a rotational speed of, for example, 240 revolutions per minute (rpm) at the maximum. At the same time, the side wall heaters 110 through 113 heat the space above the turntable 2. The heating temperature may be the same temperature as the temperature of the heater unit 7 (450 degrees C. in this example), or may be a different temperature from the temperature of the heater unit 7. The temperature adjustment of the side wall heaters 110 through 113 is performed by the temperature adjustment unit 120.

After that, the Si-containing gas and $O_3$ gas are discharged from the process gas nozzles 31 and 32, respectively. Also, a mixed gas of Ar gas, $O_2$ gas and $NH_3$ gas that are mixed with a predetermined flow rate ratio is supplied to the inner space S from the gas introduction nozzle 92, and the high-frequency power source 87 supplies a high-frequency wave to the antenna 85 of the plasma generator 80 with a power of 700 W, for example. Accordingly, plasma is generated in the inner space S. On this occasion, the side wall heaters 110 through 113 can prevent the gases supplied from the process gas nozzles 31 and 32 and the gas introduction nozzle 92 from decreasing in temperature, thereby causing each of the gases to uniformly adsorb on the surface of the wafer W. This can improve the uniformity of the deposited film in the surface across the wafer W.

Here, each of the gases supplied in the embodiments are examples, and a variety of gases can be supplied depending on the intended purpose. In the embodiment, the description has been given by citing an example of the deposition of the silicon oxide film.

While the turntable 2 rotates one revolution, oxide silicon is formed on the wafer W in a way explained as follows. That is, first, when the wafer W passes through the first process area P1 under the process gas nozzle 31, the Si-containing gas adsorbs on the surface of the wafer W. Next, when the wafer W passes through the second process area P2 under the process gas nozzle 32, the Si-containing gas is oxidized by $O_3$ gas discharged from the process gas nozzle 32, so that a layer of one molecule (or a layer of several molecules) of the silicon oxide is deposited. Next, when the wafer W passes through under the plasma generator 80, the silicon oxide layer on the wafer W is exposed to the active oxygen species and the active hydrogen species. The active oxygen species such as the oxygen radical oxidize an organic substance remaining in the oxide silicon layer included in the Si-containing gas, for example, so as to separate the organic substance from the oxide silicon layer. Accordingly, the oxide silicon layer can be made highly pure.

After the turntable 2 rotates the number of times such that a silicon oxide layer having a predetermined film thickness is deposited, the film deposition method ends by stopping supplying the Si-containing gas, $O_3$ gas, and the mixed gas of Ar gas, $O_2$ gas and $NH_3$ gas. Next, supply of $N_2$ gas from the separation gas nozzles 41 and 42, the separation gas supply tube 51 and the purge gas supply tube 72 is stopped, and rotation of the turntable 2 is stopped. After that, the wafers W are taken out from the vacuum chamber 1 by a procedure opposite to the procedure for carrying the wafer W into the vacuum chamber 1.

As discussed above, according to the film deposition apparatus of the embodiments, by providing the side wall heaters 110 through 113 covering the central axis side of the turntable 2 and the inner circumferential side wall of the chamber body 12, the gases supplied from the process gas nozzles 31 and 32 and the gas introduction nozzle 92 can be prevented from decreasing in temperature, thereby causing each of the gases to uniformly adsorb on the surface of the wafer. This can improve the uniformity of the deposited film across the surface of the wafer W.

Thus, according to the embodiments of the present invention, the uniformity of the film deposition across the surface of the substrate can be improved.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of manufacturing the silicon oxide film has been described in detail, it should be understood that the various changes, substitutions, and alterations could be made hereto without departing from the spirit and scope of the invention.

What is claimed is:

1. A film deposition apparatus comprising:
   process chamber having a substantially cylindrical shape;
   a turntable including a substrate receiving region to receive a substrate thereon provided in the process chamber;
   at least one gas nozzle a first process gas nozzle extending toward a central axis of the turntable from an inner side wall of the process chamber above the turntable along a radial direction of the turntable to supply a first process gas capable of adsorbing on the substrate;
   a second process gas nozzle extending toward the central axis of the turntable from the inner side wall of the process chamber above the turntable along a radial direction of the turntable to supply a second process gas reactable with the first process gas to produce a reaction product;
   two separation areas having a substantially sectorial convex portion protruding downward from a ceiling surface of the process chamber toward the turntable and provided in an area between the first process gas nozzle and the second process gas nozzle;
   a separation gas nozzle provided in the at least one separation area to supply a separation gas capable of separating the first process gas from the second process gas;
   a plurality of side wall heaters including an outer side wall heater and an inner side wall heater, each of the outer side wall heater and the inner side wall heater having an arc shape extending in a circumferential direction, the outer side wall heater being provided to selectively cover only part of the inner side wall of the process chamber, the inner side wall heater being provided to cover only part of a surrounding area of the central axis of the turntable in the circumferential direction, the substrate receiving region being interposed between the outer side wall heater and the inner side wall heater; and a ring-shaped protrusion portion provided in the surrounding area of the central axis of the turntable that protrudes downward,
   wherein the first process gas nozzle is provided in a first process area zoned by the two separation areas from both sides in the rotational direction of the turntable,
   wherein the second process gas nozzle is provided in a second process area zoned by the two separation areas from both sides in the rotational direction of the turntable,
   wherein at least one of the outer side wall heater and the inner side wall heater is provided in each of the first process area and the second process area, and
   wherein the inner side wall heater is provided to cover an outer circumferential side surface of the protrusion portion.

2. The film deposition apparatus as claimed in claim 1, wherein at least one of the outer side wall heart and the inner side wall heater includes a plurality of side wall heaters provided at the inner side wall of the process chamber and/or the central axis of the turntable, the plurality of side wall heaters being provided apart from each other in a circumferential direction of the process chamber and/or the turntable.

3. The film deposition apparatus as claimed in claim 1, wherein at least one of the outer side wall heart and the inner side wall heater is provided in an area including an intersection point with an extended line of the at least one gas nozzle.

4. The film deposition apparatus as claimed in claim 1, wherein at least one of the outer side wall heart and the inner side wall heater includes a heating element and a casing covering the heating element.

5. The film deposition apparatus as claimed in claim 4, wherein the casing is made of quartz.

6. The film deposition apparatus as claimed in claim 4, wherein the casing has a cut-out part to allow the at least one gas nozzle to pass therethrough at a location where the at least one gas nozzle extends.

7. The film deposition apparatus as claimed in claim 1, further comprising: a temperature adjustment unit configured to adjust a temperature of the at least one side wall heater.

8. The film deposition apparatus as claimed in claim 1, wherein the turntable can receive a plurality of substrates along a circumferential direction of the turntable.

9. The film deposition apparatus as claimed in claim 1, further comprising: a second heater provided under the turntable and configured to heat the substrate from below.

10. The film deposition apparatus as claimed in claim 1, wherein the at least one gas nozzle includes a plurality of gas nozzles provided apart from each other in a circumferential direction of the process chamber.

* * * * *